(12) United States Patent
Kim et al.

(10) Patent No.: US 9,478,486 B2
(45) Date of Patent: Oct. 25, 2016

(54) SEMICONDUCTOR DEVICE AND METHOD OF FORMING TOPSIDE AND BOTTOM-SIDE INTERCONNECT STRUCTURES AROUND CORE DIE WITH TSV

(71) Applicant: STATS ChipPAC, Ltd., Singapore (SG)

(72) Inventors: Sun Mi Kim, Kyounggi-do (KR); OhHan Kim, Kyunggi-do (KR); KyungHoon Lee, Kyunggi-do (KR)

(73) Assignee: STATS ChipPAC Pte. Ltd., Singapore (SG)

(*) Notice: Subject to any disclaimer, the term of this patent is extended or adjusted under 35 U.S.C. 154(b) by 0 days.

(21) Appl. No.: 14/267,777

(22) Filed: May 1, 2014

(65) Prior Publication Data
US 2014/0239509 A1    Aug. 28, 2014

Related U.S. Application Data

(63) Continuation of application No. 12/332,835, filed on Dec. 11, 2008, now Pat. No. 8,900,921.

(51) Int. Cl.
*H01L 25/00* (2006.01)
*H01L 23/498* (2006.01)
(Continued)

(52) U.S. Cl.
CPC ..... *H01L 23/49833* (2013.01); *H01L 21/6835* (2013.01); *H01L 23/481* (2013.01); *H01L 23/5383* (2013.01); *H01L 23/5389* (2013.01); *H01L 24/16* (2013.01); *H01L 24/19* (2013.01); *H01L 24/25* (2013.01); *H01L 24/29* (2013.01); *H01L 24/48* (2013.01); *H01L 24/83* (2013.01); *H01L 24/96* (2013.01); *H01L 25/03* (2013.01); *H01L 25/0655* (2013.01); *H01L 25/0657* (2013.01); *H01L 25/105* (2013.01); *H01L 25/16* (2013.01); *H01L 25/50* (2013.01); *H01L 23/50* (2013.01); *H01L 24/13* (2013.01); *H01L 24/73* (2013.01); *H01L 2224/0401* (2013.01); *H01L 2224/04105* (2013.01); *H01L 2224/056* (2013.01); *H01L 2224/12105* (2013.01); *H01L 2224/131* (2013.01); *H01L 2224/13099* (2013.01); *H01L 2224/16225* (2013.01); *H01L 2224/16235* (2013.01); *H01L 2224/16237* (2013.01); *H01L 2224/24195* (2013.01);
(Continued)

(58) Field of Classification Search
None
See application file for complete search history.

(56) References Cited

U.S. PATENT DOCUMENTS 5,353,498 A    10/1994 Fillion et al.
6,012,336 A    1/2000 Eaton et al.
(Continued)

*Primary Examiner* — Fei Fei Yeung Lopez
(74) *Attorney, Agent, or Firm* — Robert D. Atkins; Patent Law Group: Atkins and Associates, P.C.

(57) ABSTRACT

A semiconductor device has a core semiconductor device with a through silicon via (TSV). The core semiconductor device includes a plurality of stacked semiconductor die and semiconductor component. An insulating layer is formed around the core semiconductor device. A conductive via is formed through the insulating layer. A first interconnect structure is formed over a first side of the core semiconductor device. The first interconnect structure is electrically connected to the TSV. A second interconnect structure is formed over a second side of the core semiconductor device. The second interconnect structure is electrically connected to the TSV. The first and second interconnect structures include a plurality of conductive layers separated by insulating layers. A semiconductor die is mounted to the first interconnect structure. The semiconductor die is electrically connected to the core semiconductor device through the first and second interconnect structures and TSV.

20 Claims, 13 Drawing Sheets

(51) Int. Cl.

| | | |
|---|---|---|
| *H01L 21/683* | (2006.01) | |
| *H01L 23/48* | (2006.01) | |
| *H01L 23/538* | (2006.01) | |
| *H01L 25/065* | (2006.01) | |
| *H01L 25/10* | (2006.01) | |
| *H01L 25/03* | (2006.01) | |
| *H01L 25/16* | (2006.01) | |
| *H01L 23/50* | (2006.01) | |
| *H01L 23/00* | (2006.01) | |

(52) U.S. Cl.
CPC ............ *H01L2224/2518* (2013.01); *H01L 2224/2919* (2013.01); *H01L 2224/29111* (2013.01); *H01L 2224/32145* (2013.01); *H01L 2224/32225* (2013.01); *H01L 2224/484* (2013.01); *H01L 2224/48091* (2013.01); *H01L 2224/48227* (2013.01); *H01L 2224/48228* (2013.01); *H01L 2224/48247* (2013.01); *H01L 2224/73204* (2013.01); *H01L 2224/73265* (2013.01); *H01L 2224/83805* (2013.01); *H01L 2224/85411* (2013.01); *H01L 2224/85424* (2013.01); *H01L 2224/85439* (2013.01); *H01L 2224/85444* (2013.01); *H01L 2224/85447* (2013.01); *H01L 2224/85455* (2013.01); *H01L 2225/0651* (2013.01); *H01L 2225/0652* (2013.01); *H01L 2225/06517* (2013.01); *H01L 2225/06541* (2013.01); *H01L 2225/1005* (2013.01); *H01L 2225/1035* (2013.01); *H01L 2225/1041* (2013.01); *H01L 2225/1058* (2013.01); *H01L 2924/00014* (2013.01); *H01L 2924/0103* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01019* (2013.01); *H01L 2924/01022* (2013.01); *H01L 2924/01023* (2013.01); *H01L 2924/01028* (2013.01); *H01L 2924/01029* (2013.01); *H01L 2924/0132* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01083* (2013.01); *H01L 2924/01322* (2013.01); *H01L 2924/09701* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/1579* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/30105* (2013.01)

(56) References Cited

U.S. PATENT DOCUMENTS

| | | | |
|---|---|---|---|
| 6,489,685 | B2 | 12/2002 | Asahi et al. |
| 7,388,277 | B2 | 6/2008 | Pogge et al. |
| 7,532,785 | B1 | 5/2009 | Beausoleil et al. |
| 7,790,503 | B2 | 9/2010 | Lin et al. |
| 7,842,541 | B1 * | 11/2010 | Rusli ............... H01L 23/49833 438/106 |
| 7,872,332 | B2 | 1/2011 | Fay et al. |
| 2001/0000915 | A1 | 5/2001 | Katchmar |
| 2002/0080501 | A1 | 6/2002 | Kawae et al. |
| 2003/0119329 | A1 | 6/2003 | Lee |
| 2004/0121521 | A1 | 6/2004 | Jackson et al. |
| 2007/0155048 | A1 | 7/2007 | Lee et al. |
| 2007/0222050 | A1 | 9/2007 | Lee et al. |
| 2008/0030138 | A1 | 2/2008 | Turner |
| 2008/0136004 | A1 | 6/2008 | Yang et al. |
| 2008/0142990 | A1 * | 6/2008 | Yu et al. ...................... 257/777 |
| 2008/0303031 | A1 * | 12/2008 | Toh ..................... H01L 23/481 257/74 |
| 2008/0315395 | A1 | 12/2008 | Kim |
| 2009/0020855 | A1 * | 1/2009 | Pyeon .................... G11C 5/02 257/621 |
| 2009/0161402 | A1 * | 6/2009 | Oh ......................... G11C 5/02 365/51 |
| 2009/0302435 | A1 | 12/2009 | Pagaila et al. |
| 2010/0093169 | A1 | 4/2010 | Kuo |

* cited by examiner

SEMICONDUCTOR DEVICE AND METHOD OF FORMING TOPSIDE AND BOTTOM-SIDE INTERCONNECT STRUCTURES AROUND CORE DIE WITH TSV

CLAIM TO DOMESTIC PRIORITY

The present application is a continuation of U.S. patent application Ser. No. 12/332,835, now U.S. Pat. No. 8,900,921, filed Dec. 11, 2008, which application is incorporated herein by reference.

FIELD OF THE INVENTION

The present invention relates in general to semiconductor devices and, more particularly, to a semiconductor device with topside and bottom-side interconnect structures formed around a core die having through silicon vias (TSV). The topside and bottom-side interconnect structures are electrically connected through the core TSV die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The vertical electrical interconnection between the semiconductor package containing semiconductor devices on multiple levels (3-D device integration) and an external printed circuit board (PCB) or substrate is typically accomplished with wire bonds, through hole vias (THV), or through silicon vias (TSV). Wire bonds require additional package area to form the bend in the leads. To make electrical interconnect using THVs or TSVs, a temporary carrier is bonded to the package substrate for structural support while forming the THVs and TSVs. In most THVs, the sidewalls and bottom-side of the via are conformally plated with a conductive material to enhance adhesion. The THVs are then filled with another conductive material, for example, copper deposition by an electroplating process. The THV formation typically involves considerable time for the via filling, which reduces the unit-per-hour (UPH) production schedule. The equipment need for electroplating, e.g., plating bath, and sidewall passivation increases manufacturing cost. In addition, voids may be formed within the vias, which causes defects and reduces reliability of the device. THV can be a slow and costly approach to make vertical electrical interconnections in semiconductor packages.

SUMMARY OF THE INVENTION

A need exists for a semiconductor device with an improved vertical interconnect structure. Accordingly, in one embodiment, the present invention is a method of making a semiconductor device comprising the steps of providing a first conductive layer, disposing a first semiconductor die including a conductive via formed through the first semiconductor die over the first conductive layer, forming an insulating layer over the first semiconductor die, and disposing a second conductive layer over the first semiconductor die and insulating layer.

In another embodiment, the present invention is a method of making a semiconductor device comprising the steps of providing a first semiconductor die including a first conductive via formed through the first semiconductor die, forming a first interconnect structure over the first semiconductor die, and forming a second interconnect structure over the first semiconductor die opposite the first interconnect structure.

In another embodiment, the present invention is a semiconductor device comprising a first semiconductor die including a first conductive via formed through the first semiconductor die. A first conductive layer is formed over the first semiconductor die. A second conductive layer is formed over the first semiconductor die opposite the first conductive layer.

In another embodiment, the present invention is a semiconductor device comprising a first substrate including a first conductive via formed through the first substrate. A first interconnect structure is formed over the first substrate. A second interconnect structure is formed over the first substrate opposite the first interconnect structure.

DETAILED DESCRIPTION OF THE DRAWINGS

Figure 1:
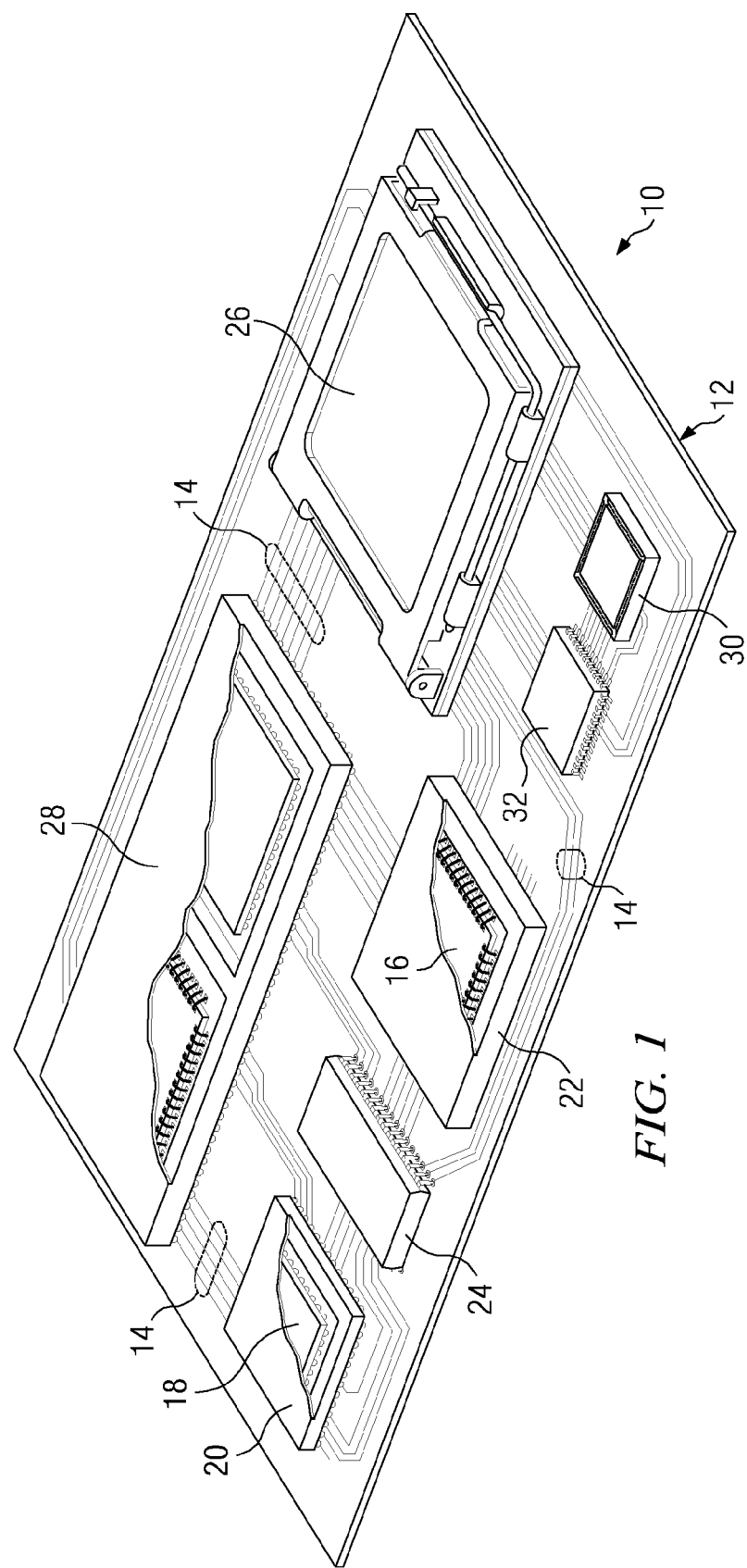
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
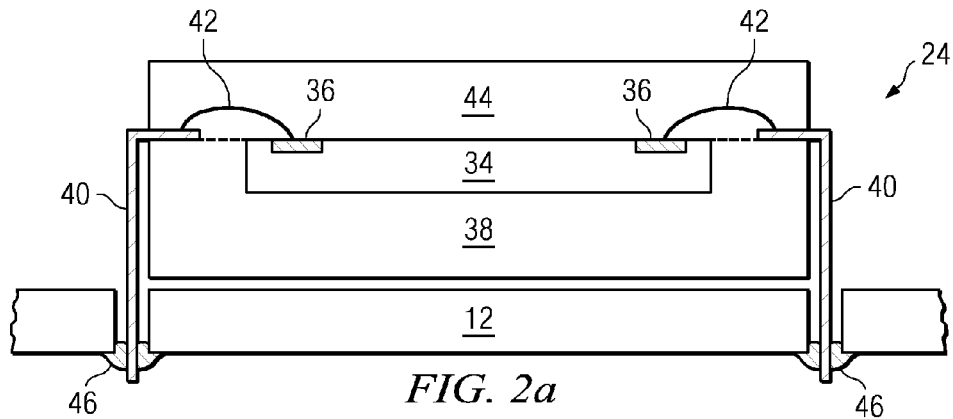
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
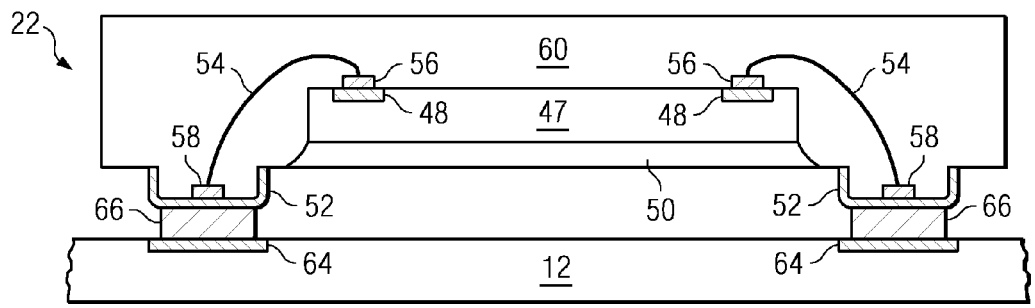

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
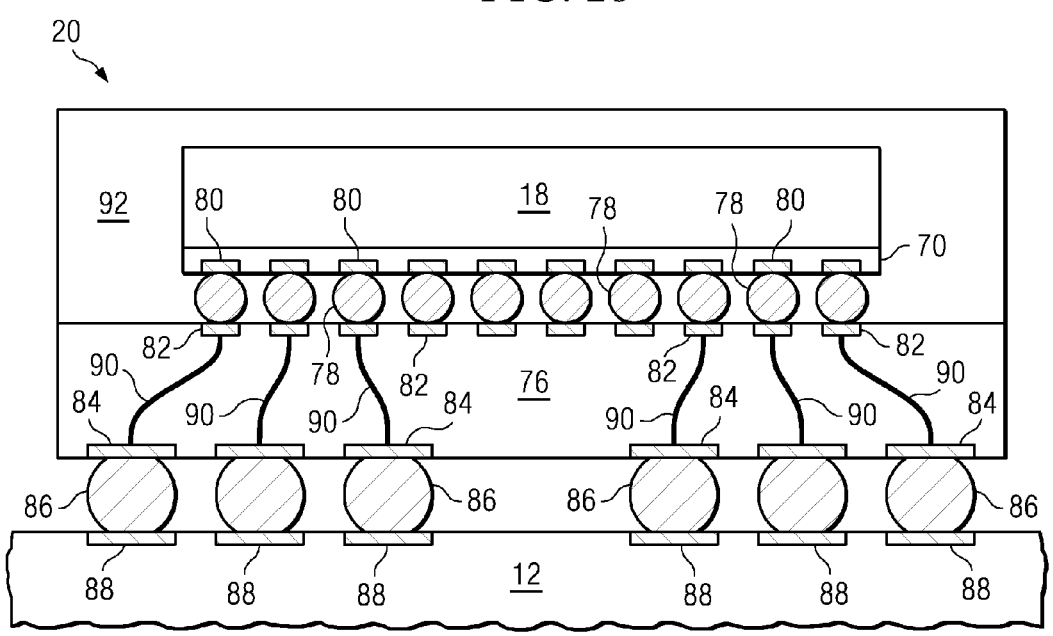

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
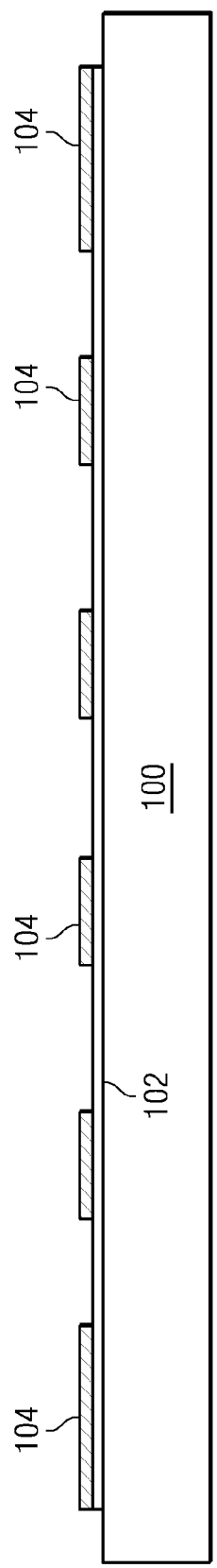
FIGS. 3a-3e illustrate a process of forming topside and bottom-side interconnect structure over a core semiconductor device and interconnected through TSV.

FIGS. 3a-3e illustrate a process of forming topside and bottom-side interconnect structures around a semiconductor die having through silicon vias (TSV). The TSVs electrically connect the topside and bottom-side interconnect structures. FIG. 3a shows a temporary process carrier or substrate 100 with an adhesive layer 102 deposited on its surface. Carrier 100 is a temporary or sacrificial base material such as silicon, ceramic, glass, metal, or other suitable low-cost, rigid material. Adhesive layer 102 can be a flexible plastic base film, such as polyvinyl chloride (PVC) or polyolefin, with a synthetic acrylic adhesive, thermal sensitive, ultraviolet (UV)-sensitive adhesive, for device mounting and removal. Adhesive layer 102 is releasable by light, heat, laser, or mechanical pressure. Adhesive layer 102 is deposited using spin coating or printing, and may include a laminated polymer adhesive or UV curable liquid adhesive. Alternatively, an adhesive material, such as thermal epoxy, polymer composite, or inorganic bonding compounds, can be applied to carrier 100.

An electrically conductive pattern layer 104 is formed over adhesive layer 102 using a patterning and deposition process. Conductive layer 104 can be Al, Cu, Sn, Ni, Au, Ag, or other suitable electrically conductive material. The deposition of conductive layer 104 uses etched lead-frame, metal foil, evaporation, sputtering, PVD, CVD, electrolytic plating, or electroless plating process to a thickness of 20-80 micrometers (μm).

Figure 3B:
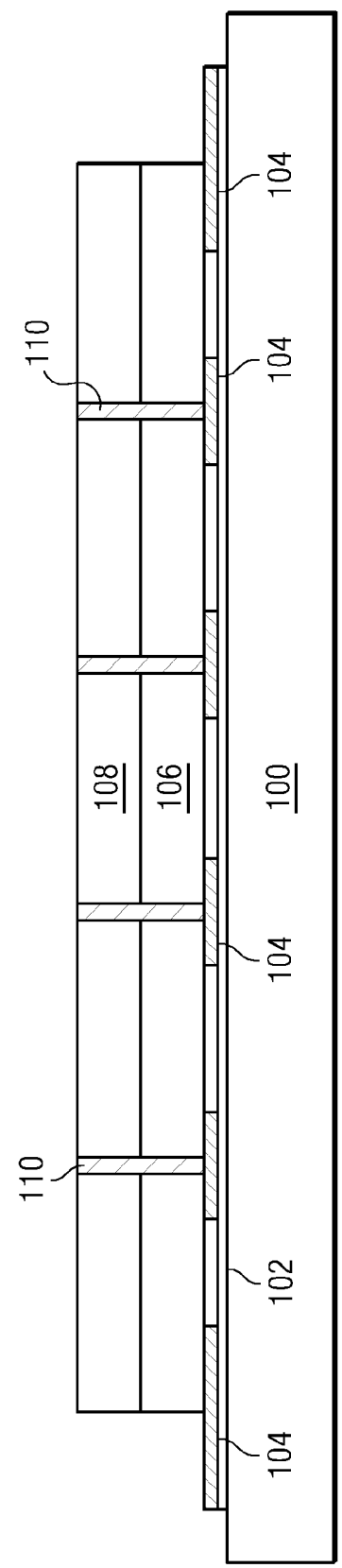

In FIG. 3b, core semiconductor die 106 and 108 are vertically stacked over carrier 100 with solder paste or conductive material such as tape or epoxy. Semiconductor die 106 and 108 each include a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 106 and 108 to implement application specific integrated circuit (ASIC) or memory devices. A plurality of TSV 110 are formed through semiconductor die 106 and 108 by etching or drilling a via through the silicon material and filling the via with Al, Cu, Sn, Ni, Au, Ag, titanium (Ti), tungsten (W), or other suitable electrically conductive material. TSVs 110 are electrically connected to conductive pattern layer 104.

Figure 3C:
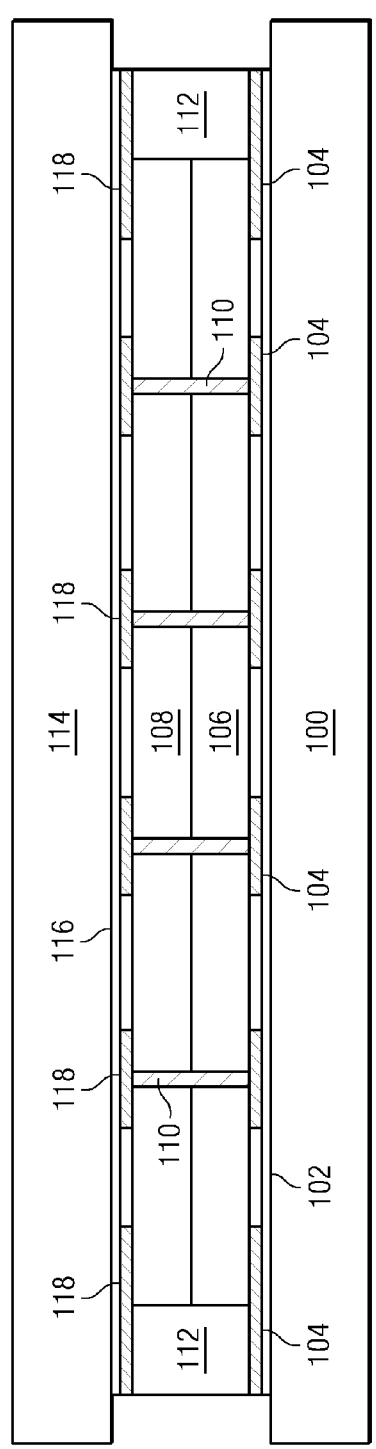

In FIG. 3c, an insulating layer 112 is deposited around the stacked semiconductor die 106-108. The insulating layer 112 can be a thermosetting resin or photo-curable resin, such as epoxy resin, phenol resin, cyanate resin, fiberglass, fluorocarbon resin, poly(tetrafluoroethylene) (PTFE) resin, polyphenylene oxide (PPO) resin, or poly(phenylene ether) (PPE) resin. The core semiconductor die 106-108 are thus embedded within insulating layer 112.

A temporary process carrier or substrate 114 has an adhesive layer 116 deposited on its surface. Carrier 114 is a temporary or sacrificial base material such as silicon, ceramic, glass, metal, or other suitable low-cost, rigid material. Adhesive layer 116 can be a flexible plastic base film, such as PVC or polyolefin, with a synthetic acrylic adhesive, thermal sensitive, UV-sensitive adhesive, for device mounting and removal. Adhesive layer 116 is releasable by light, heat, laser, or mechanical pressure. Adhesive layer 116 is deposited using spin coating or printing, and may include a laminated polymer adhesive or UV curable liquid adhesive. Alternatively, an adhesive material, such as thermal epoxy, polymer composite, or inorganic bonding compounds, can be applied to carrier 114.

An electrically conductive pattern layer 118 is formed over adhesive layer 116 using a patterning and deposition process. Conductive layer 118 can be Al, Cu, Sn, Ni, Au, Ag, or other suitable electrically conductive material. The deposition of conductive layer 118 uses etched lead-frame, metal foil, evaporation, sputtering, PVD, CVD, electrolytic plating, or electroless plating process to a thickness of 20-80 μm.

Leading with conductive layer 118, carrier 114 is mounted to semiconductor die 108, opposite carrier 100, such that conductive layer 118 electrically contacts TSV 110. Carriers 100 and 114, as well as adhesive layers 104 and 116 are removed by chemical etching, mechanical peel-off, CMP, or mechanical grinding.

Figure 3D:
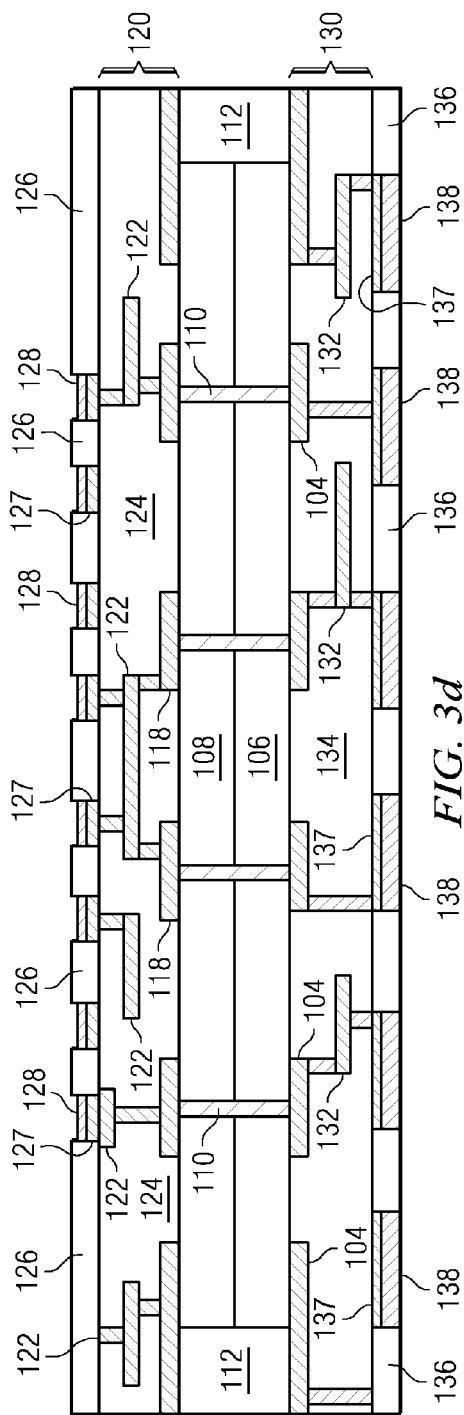

In FIG. 3d, a topside interconnect structure 120 is formed over conductive layer 118 and semiconductor die 108. The interconnect structure 120 includes conductive layers and signal traces 122, which are separated by insulating layers 124. The insulating layers 124 can be silicon dioxide (SiO2), silicon nitride (Si3N4), silicon oxynitride (SiON), tantalum pentoxide (Ta2O5), zircon (ZrO2), aluminum oxide (Al2O3), or other suitable dielectric material. The insulating layers 124 are patterned or blanket deposited using PVD, CVD, printing, sintering, or thermal oxidation. The interconnect structure 120 is electrically connected to TSVs 110 and the active and passive devices within semiconductor die 106 and 108 to form functional electrical circuits according to the electrical design and function of the semiconductor die.

A solder resist layer 126 is formed over topside interconnect structure 120. A portion of solder resist layer 126 is removed by an etching process to expose conductive layer 122. An electrically conductive layer 127 is formed over interconnect structure 120 in the removed portions of solder resist layer 126 using a patterning and deposition process. An electrically conductive layer 128 is formed over conductive layer 127 using a patterning and deposition process. Conductive layers 127 and 128 can be Al, Cu, Sn, Ni, Au, Ag, or other suitable material. The deposition of conductive layers 127 and 128 use PVD, CVD, electrolytic plating, or electroless plating process. Conductive layers 127 and 128 are electrically connected to conductive layer 122 according to the electrical design and function of the die.

A bottom-side interconnect structure 130 is formed over conductive layer 104 and semiconductor die 106. The interconnect structure 130 includes conductive layers and signal traces 132, which are separated by insulating layers 134. The insulating layers 134 can be SiO2, Si3N4, SiON, Ta2O5, ZrO2, Al2O3, or other suitable dielectric material. The insulating layers 134 are patterned or blanket deposited using PVD, CVD, printing, sintering, or thermal oxidation. The interconnect structure 130 is electrically connected to TSVs 110 and the active and passive devices within semiconductor die 106 and 108 to form functional electrical circuits according to the electrical design and function of the semiconductor die.

A solder resist layer 136 is formed over bottom-side interconnect structure 130. A portion of solder resist layer 136 is removed by an etching process to expose conductive layer 132. An electrically conductive layer 137 is formed over interconnect structure 130 in the removed portions of solder resist layer 136 using a patterning and deposition process. An electrically conductive layer 138 is formed over conductive layer 137 using a patterning and deposition process. Conductive layers 137 and 138 can be Al, Cu, Sn, Ni, Au, Ag, or other suitable material. The deposition of conductive layers 137 and 138 use PVD, CVD, electrolytic plating, or electroless plating process. Conductive layers 137 and 138 are electrically connected to conductive layer 132 according to the electrical design and function of the die.

Figure 3E:
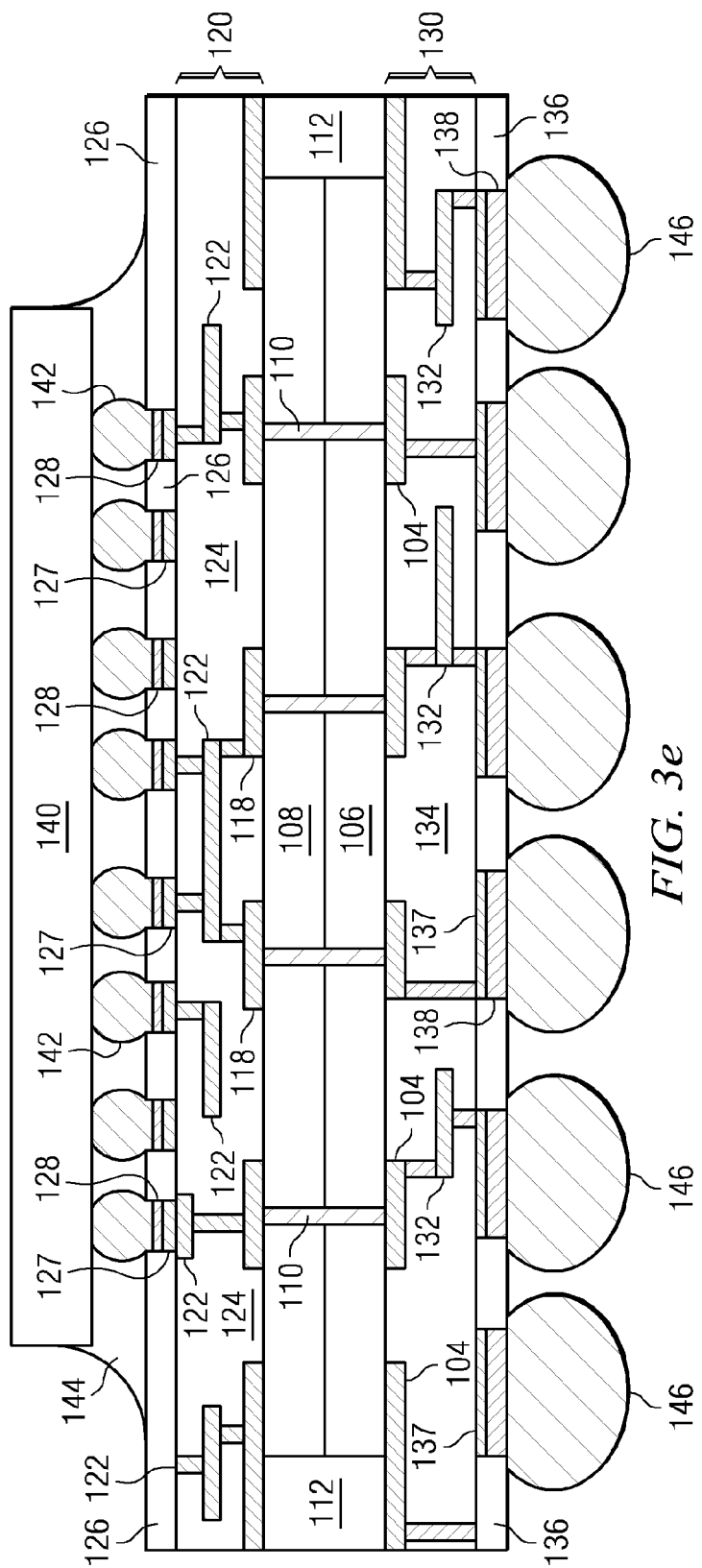

In FIG. 3e, a semiconductor die 140 is mounted to conductive layer 128 with solder bumps 142. An underfill material 144, such as epoxy, polymeric material, film, or other non-conductive material, is deposited under semiconductor die 140. Semiconductor die 140 is electrically connected to semiconductor die 106 and 108 through solder bumps 142, conductive layers 127 and 128, interconnect structures 120 and 130, and TSV 110.

An electrically conductive solder material is deposited over conductive layer 138 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 146. In some applications, solder bumps 146 are reflowed a second time to improve electrical contact to conductive layer 138. Solder bumps 146 represent one type of interconnect structure that can be formed over conductive layer 138. The interconnect structure can also use bond wires, 3D interconnects, conductive paste, or other electrical interconnect.

Figure 4:
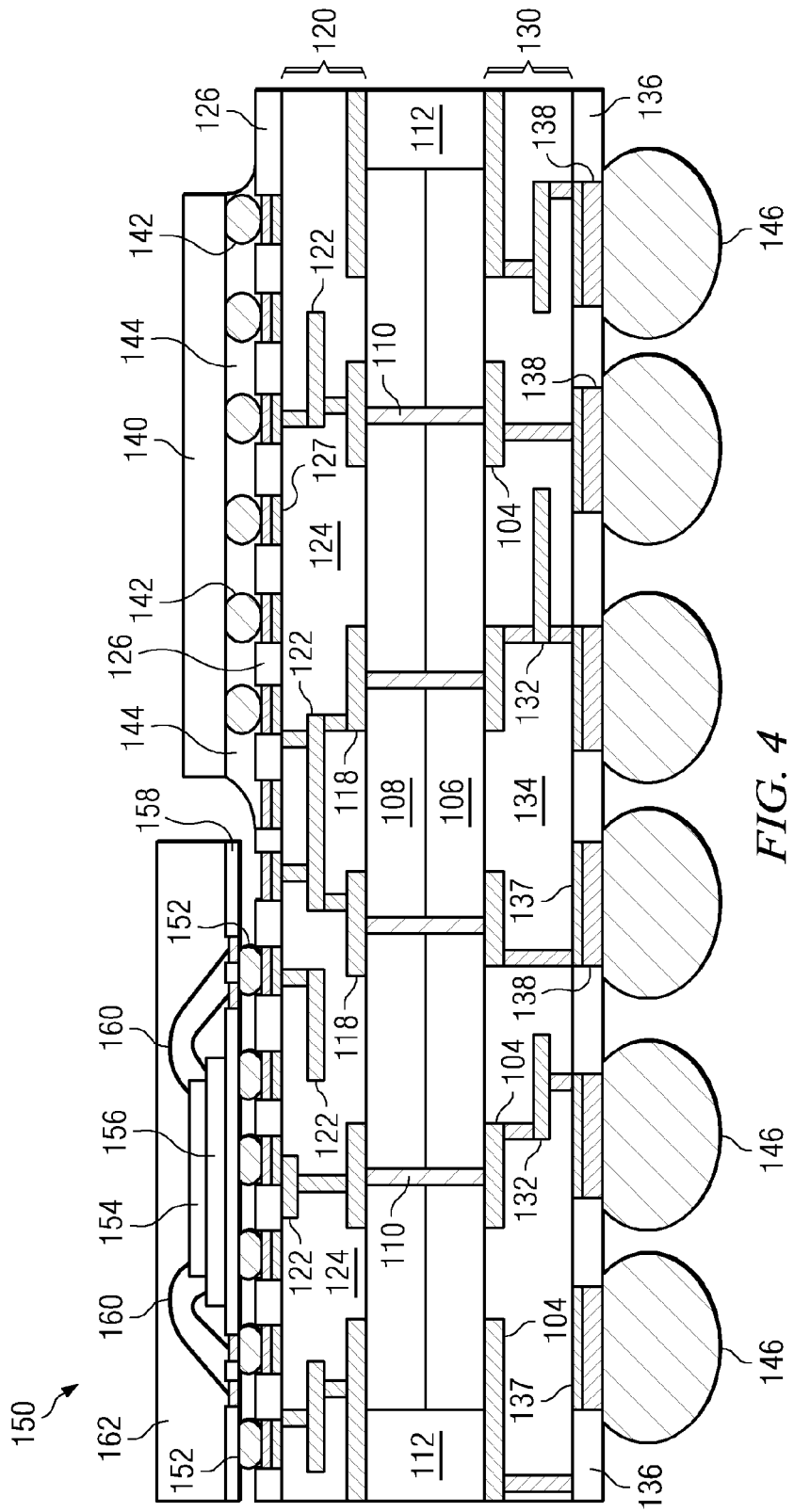
FIG. 4 illustrates the core semiconductor device with a semiconductor die mounted to the interconnect structure.

FIG. 4 shows a similar device as FIG. 3e with the addition of semiconductor package 150 mounted to conductive layer 128 with solder bumps 152. Semiconductor package 150 includes stacked semiconductor die 154 and 156 electrically connected to substrate 158 with bond wires 160. An encapsulant or molding compound 162 is deposited over semiconductor die 154 and 156, bond wires 160, and substrate 158 using a printing, compressive molding, transfer molding, liquid encapsulant molding, or other suitable applicator. Encapsulant 162 can be epoxy resin, epoxy acrylate, polymer, or polymer composite material. Encapsulant 162 is non-conductive and environmentally protects the semiconductor device from external elements and contaminants. Semiconductor die 154 and 156 are electrically connected to core semiconductor die 106 and 108 through bond wires 160, solder bumps 152, conductive layers 127 and 128, interconnect structures 120 and 130, and TSV 110.

The embodiment of FIG. 4 is a multi-functional semiconductor package. By using the TSV within the core die, the semiconductor package provides vertical electrical connection between the topside and bottom-side interconnect structures without using conventional through holes vias (THV). The core semiconductor die 106-108 constitute embedded substrates between the topside and bottom-side interconnect structures.

Figure 5:
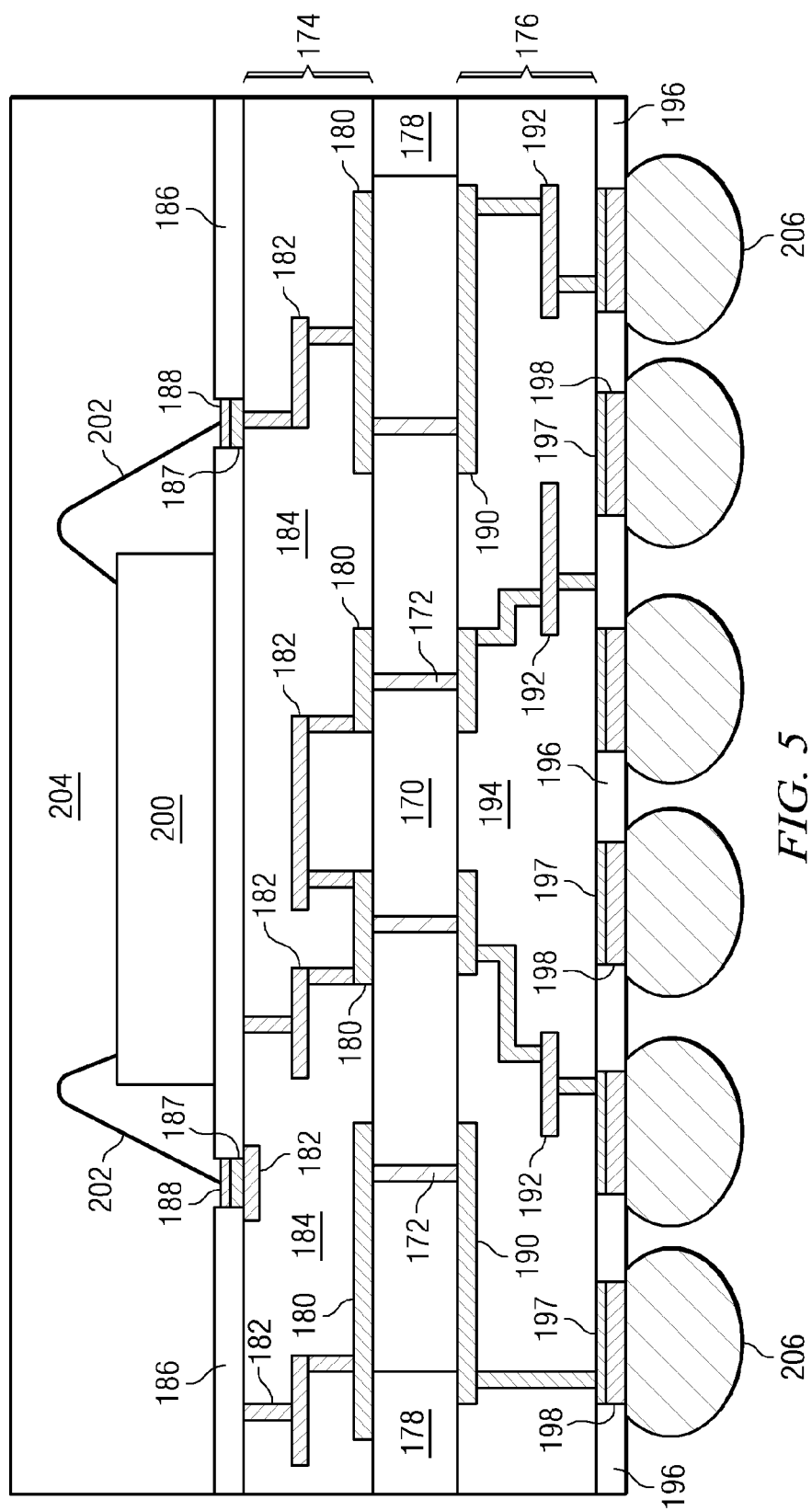
FIG. 5 illustrates a single TSV die core with a semiconductor die mounted to the interconnect structure.

In FIG. 5, core semiconductor die 170 with TSVs 172 is disposed between topside interconnect structure 174 and bottom-side interconnect structure 176 using a process similar to FIGS. 3a-3d. Semiconductor die 170 includes a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 170 to implement ASIC or memory devices. TSV 172 are formed through semiconductor die 170 by etching or drilling a via through the silicon material and filling the via with Al, Cu, Sn, Ni, Au, Ag, Ti, W, or other suitable electrically conductive material.

An insulating layer 178 is deposited around core semiconductor die 170. The insulating layer 178 can be a thermosetting resin or photo-curable resin, such as epoxy resin, phenol resin, cyanate resin, fiberglass, fluorocarbon resin, PTFE resin, PPO resin, or PPE resin. The core semiconductor die 170 is thus embedded within insulating layer 178.

The topside interconnect structure 174 includes conductive layer 180, conductive layers and signal traces 182, which are separated by insulating layers 184. The insulating layers 184 can be SiO2, Si3N4, SiON, Ta2O5, ZrO2, Al2O3, or other suitable dielectric material. The insulating layers 184 are patterned or blanket deposited using PVD, CVD, printing, sintering, or thermal oxidation. The interconnect structure 174 is electrically connected to TSVs 172 and the active and passive devices within semiconductor die 170 to form functional electrical circuits according to the electrical design and function of the semiconductor die.

A solder resist layer 186 is formed over topside interconnect structure 174. A portion of solder resist layer 186 is removed by an etching process to expose conductive layer 182. An electrically conductive layer 187 is formed over interconnect structure 174 in the removed portions of solder resist layer 186 using a patterning and deposition process. An electrically conductive layer 188 is formed over conductive layer 187 using a patterning and deposition process. Conductive layers 187 and 188 can be Al, Cu, Sn, Ni, Au, Ag, or other suitable material. The deposition of conductive layers 187 and 188 use PVD, CVD, electrolytic plating, or electroless plating process. Conductive layers 187 and 188 are electrically connected to conductive layer 182 according to the electrical design and function of the die.

The bottom-side interconnect structure 176 includes conductive layer 190, conductive layers and signal traces 192, which are separated by insulating layers 194. The insulating layers 194 can be SiO2, Si3N4, SiON, Ta2O5, ZrO2, Al2O3, or other suitable dielectric material. The insulating layers 194 are patterned or blanket deposited using PVD, CVD, printing, sintering, or thermal oxidation. The interconnect structure 176 is electrically connected to TSVs 172 and the active and passive devices within semiconductor die 170 to form functional electrical circuits according to the electrical design and function of the semiconductor die.

A solder resist layer 196 is formed over bottom-side interconnect structure 176. A portion of solder resist layer 196 is removed by an etching process to expose conductive layer 192. An electrically conductive layer 197 is formed over interconnect structure 176 in the removed portions of solder resist layer 196 using a patterning and deposition process. An electrically conductive layer 198 is formed over conductive layer 197 using a patterning and deposition process. Conductive layers 197 and 198 can be Al, Cu, Sn, Ni, Au, Ag, or other suitable material. The deposition of conductive layers 197 and 198 use PVD, CVD, electrolytic plating, or electroless plating process. Conductive layers 197 and 198 are electrically connected to conductive layer 192 according to the electrical design and function of the die.

A semiconductor die 200 is mounted to solder resist layer 186. Semiconductor die 200 is electrically connected to core semiconductor die 170 through bond wires 202, conductive layers 187 and 188, interconnect structures 174 and 176, and TSV 172. An encapsulant or molding compound 204 is deposited over semiconductor die 200, bond wires 202, and solder resist layer 186 using a printing, compressive molding, transfer molding, liquid encapsulant molding, or other suitable applicator. Encapsulant 204 can be epoxy resin, epoxy acrylate, polymer, or polymer composite material. Encapsulant 204 is non-conductive and environmentally protects the semiconductor device from external elements and contaminants.

An electrically conductive solder material is deposited over conductive layer 198 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 206. In some applications, solder bumps 206 are reflowed a second time to improve electrical contact to conductive layer 198. Solder bumps 206 represent one type of interconnect structure that can be formed over conductive layer 198. The interconnect structure can also use bond wires, 3D interconnects, conductive paste, or other electrical interconnect.

Figure 6:
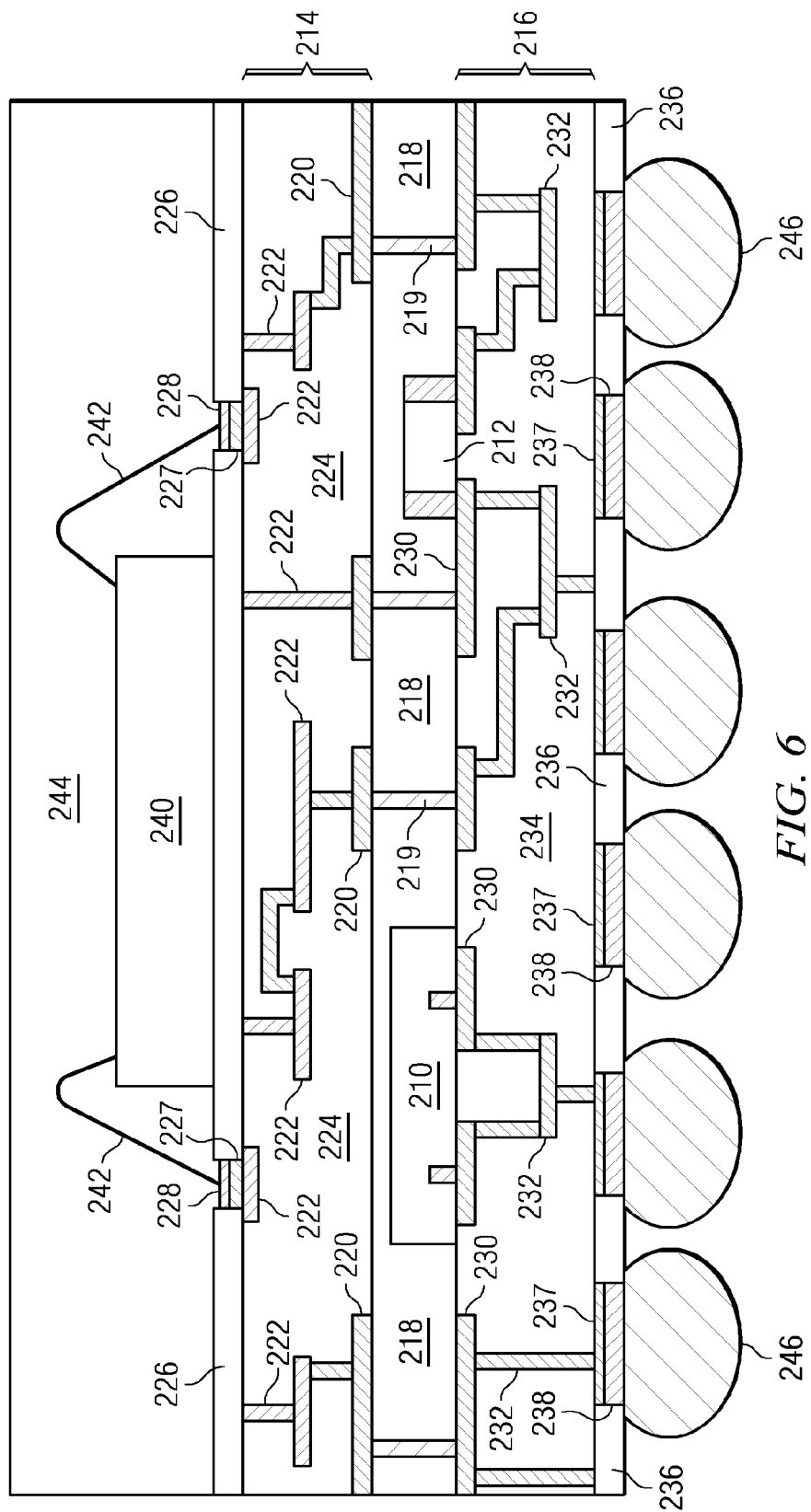
FIG. 6 illustrates a single TSV die and component core with a semiconductor die mounted to the interconnect structure.

In FIG. 6, the core semiconductor device includes semiconductor die 210 and semiconductor component 212 which are disposed between topside interconnect structure 214 and bottom-side interconnect structure 216 using a process similar to FIGS. 3a-3d. Semiconductor die 210 includes a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 210 to implement ASIC or memory devices. Semiconductor component 212 may be a passive device such as a large value capacitor or resistor. An insulating layer 218 is deposited around core semiconductor die 210 and semiconductor component 212. The insulating layer 218 can be a thermosetting resin or photo-curable resin, such as epoxy resin, phenol resin, cyanate resin, fiberglass, fluorocarbon resin, PTFE resin, PPO resin, or PPE resin. The core semiconductor die 210 and semiconductor component 212 are thus embedded within insulating layer 218. Conductive vias 219 are formed through insulating layer 218 by etching or drilling a via through insulating material 218 and filling the via with Al, Cu, Sn, Ni, Au, Ag, Ti, W, or other suitable electrically conductive material.

The topside interconnect structure 214 includes conductive layer 220, conductive layers and signal traces 222, which are separated by insulating layers 224. The insulating layers 224 can be SiO2, Si3N4, SiON, Ta2O5, ZrO2, Al2O3, or other suitable dielectric material. The insulating layers 224 are patterned or blanket deposited using PVD, CVD, printing, sintering, or thermal oxidation. The interconnect structure 214 is electrically connected to conductive vias 219 and the active and passive devices within semiconductor die 210 and semiconductor component 212 to form functional electrical circuits according to the electrical design and function of the semiconductor die.

A solder resist layer 226 is formed over topside interconnect structure 214. A portion of solder resist layer 226 is removed by an etching process to expose conductive layer 222. An electrically conductive layer 227 is formed over interconnect structure 214 in the removed portions of solder resist layer 226 using a patterning and deposition process. An electrically conductive layer 228 is formed over conductive layer 227 using a patterning and deposition process. Conductive layers 227 and 228 can be Al, Cu, Sn, Ni, Au, Ag, or other suitable material. The deposition of conductive layers 227 and 228 use PVD, CVD, electrolytic plating, or electroless plating process. Conductive layers 227 and 228 are electrically connected to conductive layer 222 according to the electrical design and function of the die.

The bottom-side interconnect structure 216 includes conductive layer 230, conductive layers and signal traces 232, which are separated by insulating layers 234. The insulating layers 234 can be SiO2, Si3N4, SiON, Ta2O5, ZrO2, Al2O3, or other suitable dielectric material. The insulating layers 234 are patterned or blanket deposited using PVD, CVD, printing, sintering, or thermal oxidation. The interconnect structure 216 is electrically connected to conductive vias 219 and the active and passive devices within semiconductor die 210 and semiconductor component 212 and to form functional electrical circuits according to the electrical design and function of the semiconductor die.

A solder resist layer 236 is formed over bottom-side interconnect structure 216. A portion of solder resist layer 236 is removed by an etching process to expose conductive layer 232. An electrically conductive layer 237 is formed over interconnect structure 216 in the removed portions of solder resist layer 236 using a patterning and deposition process. An electrically conductive layer 238 is formed over conductive layer 237 using a patterning and deposition process. Conductive layers 237 and 238 can be Al, Cu, Sn, Ni, Au, Ag, or other suitable material. The deposition of conductive layers 237 and 238 use PVD, CVD, electrolytic plating, or electroless plating process. Conductive layers 237 and 238 are electrically connected to conductive layer 232 according to the electrical design and function of the die.

A semiconductor die 240 is mounted to solder resist layer 226. Semiconductor die 240 is electrically connected to core semiconductor die 210 and semiconductor component 212 through bond wires 242, conductive layers 227 and 228, interconnect structures 214 and 216, and conductive vias 219. An encapsulant or molding compound 244 is deposited over semiconductor die 240, bond wires 242, and solder resist layer 226 using a printing, compressive molding, transfer molding, liquid encapsulant molding, or other suitable applicator. Encapsulant 244 can be epoxy resin, epoxy acrylate, polymer, or polymer composite material. Encapsulant 244 is non-conductive and environmentally protects the semiconductor device from external elements and contaminants.

An electrically conductive solder material is deposited over conductive layer 238 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 246. In some applications, solder bumps 246 are reflowed a second time to improve electrical contact to conductive layer 238. Solder bumps 246 represent one type of interconnect structure that can be formed over conductive layer 238. The interconnect structure can also use bond wires, 3D interconnects, conductive paste, or other electrical interconnect.

Figure 7:
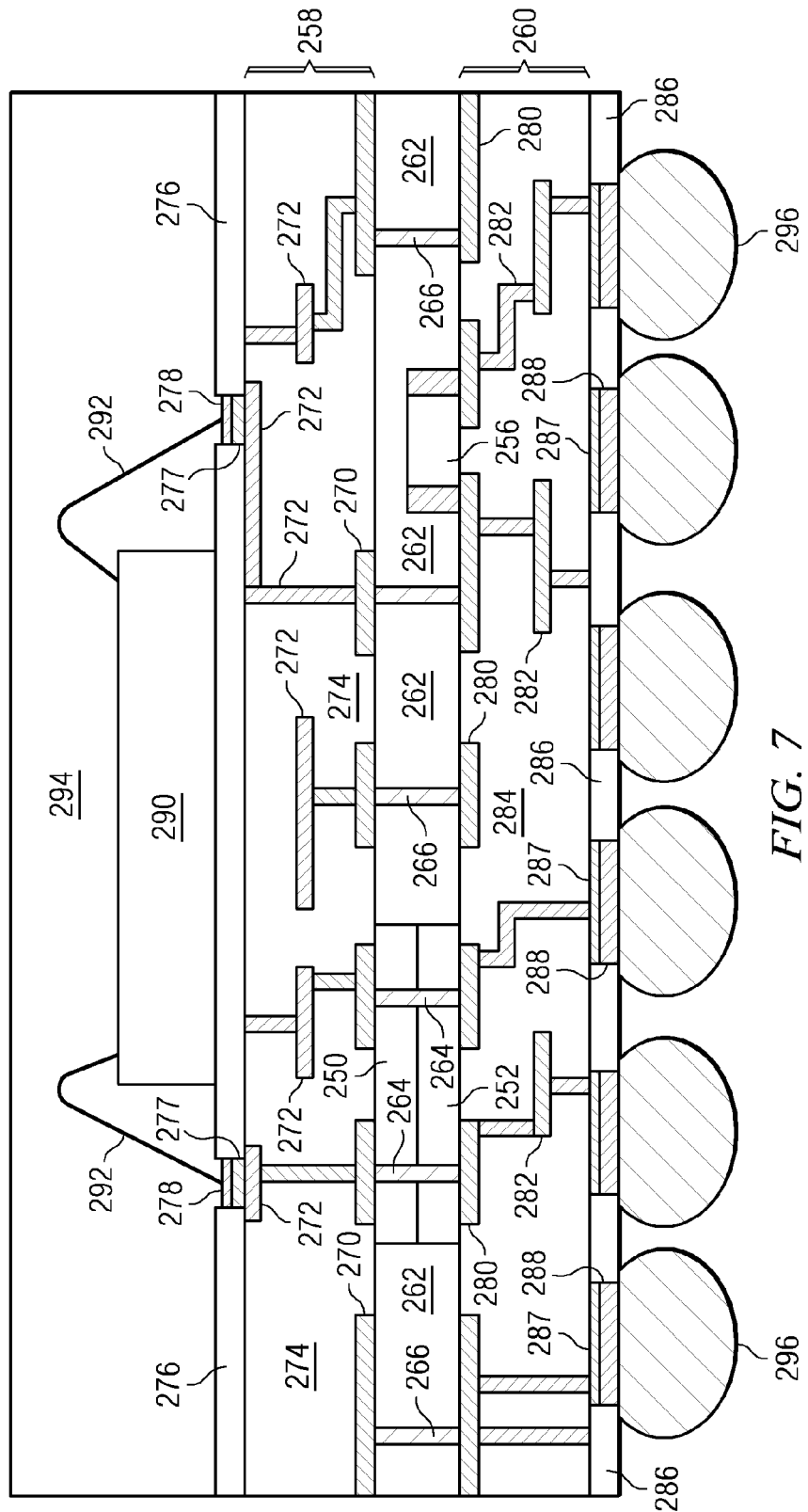
FIG. 7 illustrates a dual TSV die and component core with a semiconductor die mounted to the interconnect structure.

In FIG. 7, the core semiconductor device includes semiconductor die 250 and 252 and semiconductor component 256 which are disposed between topside interconnect structure 258 and bottom-side interconnect structure 260 using a process similar to FIGS. 3a-3d. Semiconductor die 250 and 252 each includes a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 250 and 252 to implement ASIC or memory devices. Semiconductor component 256 may be a passive device such as a large value capacitor or resistor. An insulating layer 262 is deposited around core semiconductor die 250 and 252 and semiconductor component 256. The insulating layer 262 can be a thermosetting resin or photo-curable resin, such as epoxy resin, phenol resin, cyanate resin, fiberglass, fluorocarbon resin, PTFE resin, PPO resin, or PPE resin. The core semiconductor die 250 and 252 and semiconductor component 256 are thus embedded within insulating layer 262. A plurality of TSV 264 are formed through semiconductor die 250 and 252 by etching or drilling a via through the silicon material and filling the via with Al, Cu, Sn, Ni, Au, Ag, Ti, W, or other suitable electrically conductive material. A plurality of conductive vias 266 are formed through insulating layer 262 by etching or drilling a via through insulating material 262 and filling the via with Al, Cu, Sn, Ni, Au, Ag, Ti, W, or other suitable electrically conductive material.

The topside interconnect structure 258 includes conductive layer 270, conductive layers and signal traces 272, which are separated by insulating layers 274. The insulating layers 274 can be SiO2, Si3N4, SiON, Ta2O5, ZrO2, Al2O3, or other suitable dielectric material. The insulating layers 274 are patterned or blanket deposited using PVD, CVD, printing, sintering, or thermal oxidation. The interconnect structure 258 is electrically connected to TSV 264 and conductive vias 266 and the active and passive devices within semiconductor die 250 and 252 and semiconductor component 256 to form functional electrical circuits according to the electrical design and function of the semiconductor die.

A solder resist layer 276 is formed over topside interconnect structure 258. A portion of solder resist layer 276 is removed by an etching process to expose conductive layer 272. An electrically conductive layer 277 is formed over interconnect structure 258 in the removed portions of solder resist layer 276 using a patterning and deposition process. An electrically conductive layer 278 is formed over conductive layer 277 using a patterning and deposition process. Conductive layers 277 and 278 can be Al, Cu, Sn, Ni, Au, Ag, or other suitable material. The deposition of conductive layers 277 and 278 use PVD, CVD, electrolytic plating, or electroless plating process. Conductive layers 277 and 278 are electrically connected to conductive layer 272 according to the electrical design and function of the die.

The bottom-side interconnect structure 260 includes conductive layer 280, conductive layers and signal traces 282, which are separated by insulating layers 284. The insulating layers 284 can be SiO2, Si3N4, SiON, Ta2O5, ZrO2, Al2O3, or other suitable dielectric material. The insulating layers 284 are patterned or blanket deposited using PVD, CVD, printing, sintering, or thermal oxidation. The interconnect structure 260 is electrically connected to TSV 264 and conductive vias 266 and the active and passive devices within semiconductor die 250 and 252 and semiconductor component 256 to form functional electrical circuits according to the electrical design and function of the semiconductor die.

A solder resist layer 286 is formed over bottom-side interconnect structure 260. A portion of solder resist layer 286 is removed by an etching process to expose conductive layer 282. An electrically conductive layer 287 is formed over interconnect structure 260 in the removed portions of solder resist layer 286 using a patterning and deposition process. An electrically conductive layer 288 is formed over conductive layer 287 using a patterning and deposition process. Conductive layers 287 and 288 can be Al, Cu, Sn, Ni, Au, Ag, or other suitable material. The deposition of conductive layers 287 and 288 use PVD, CVD, electrolytic plating, or electroless plating process. Conductive layers 287 and 288 are electrically connected to conductive layer 282 according to the electrical design and function of the die.

A semiconductor die 290 is mounted to solder resist layer 276. Semiconductor die 290 is electrically connected to core semiconductor die 250 and 252 and semiconductor component 256 through bond wires 292, conductive layers 287 and 288, interconnect structures 258 and 260, TSV 264, and conductive vias 266. An encapsulant or molding compound 294 is deposited over semiconductor die 290, bond wires 292, and solder resist layer 276 using a printing, compressive molding, transfer molding, liquid encapsulant molding, or other suitable applicator. Encapsulant 294 can be epoxy resin, epoxy acrylate, polymer, or polymer composite material. Encapsulant 294 is non-conductive and environmentally protects the semiconductor device from external elements and contaminants.

An electrically conductive solder material is deposited over conductive layer 288 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 296. In some applications, solder bumps 296 are reflowed a second time to improve electrical contact to conductive layer 288. Solder bumps 296 represent one type of interconnect structure that can be formed over conductive layer 288. The interconnect structure can also use bond wires, 3D interconnects, conductive paste, or other electrical interconnect.

Figure 8:
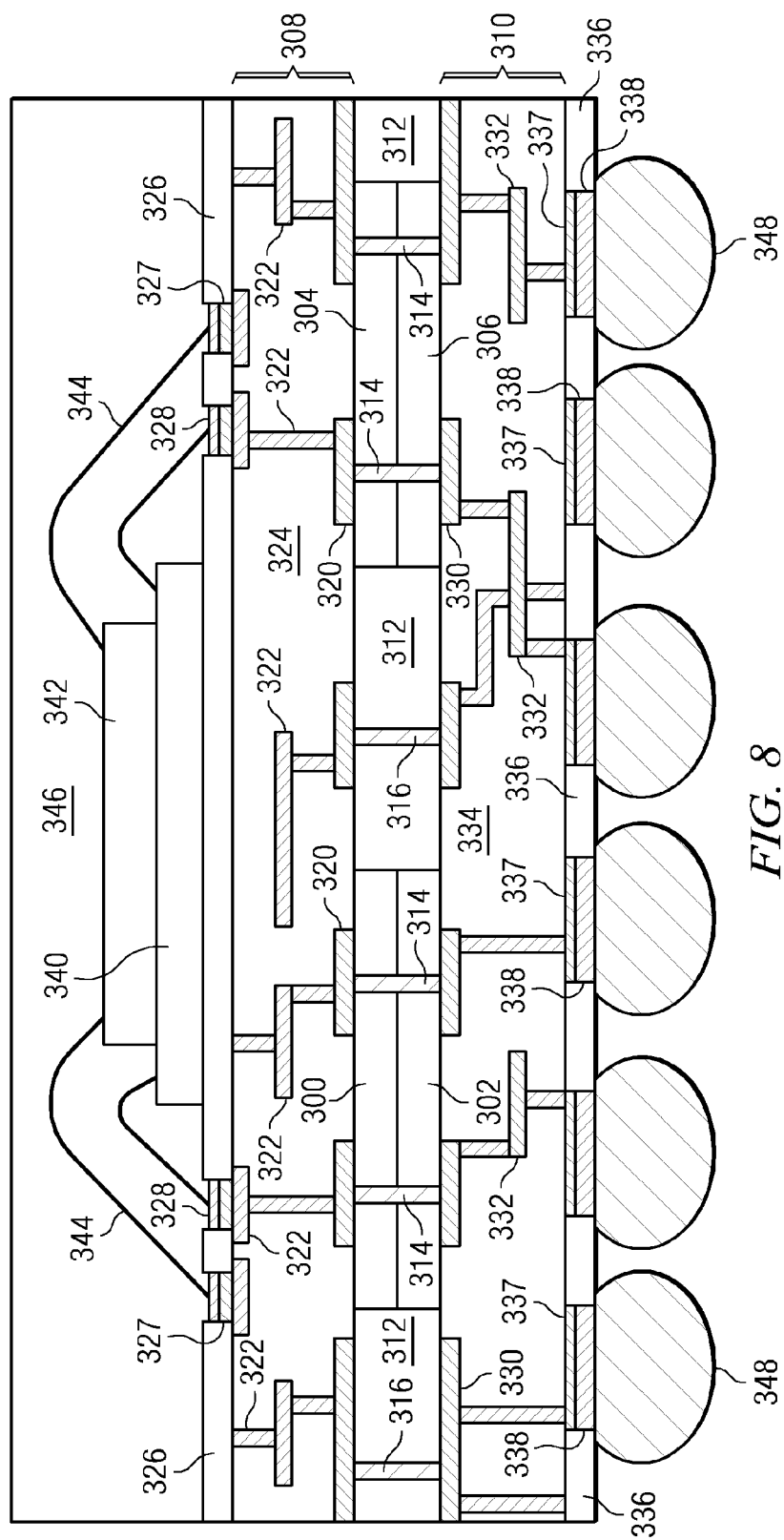
FIG. 8 illustrates a dual TSV die core with a semiconductor die mounted to the interconnect structure.

In FIG. 8, the core semiconductor device includes vertically stacked semiconductor die 300 and 302 and vertically stacked semiconductor die 304 and 306 which are disposed between topside interconnect structure 308 and bottom-side interconnect structure 310 using a process similar to FIGS. 3a-3d. Semiconductor die 300-306 each includes a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 300-306 to implement ASIC or memory devices. An insulating layer 312 is deposited around core semiconductor die 300-306. The insulating layer 312 can be a thermosetting resin or photo-curable resin, such as epoxy resin, phenol resin, cyanate resin, fiberglass, fluorocarbon resin, PTFE resin, PPO resin, or PPE resin. The core semiconductor die 300-306 are thus embedded within insulating layer 312. A plurality of TSV 314 are formed through semiconductor die 300-306 by etching or drilling a via through the silicon material and filling the via with Al, Cu, Sn, Ni, Au, Ag, Ti, W, or other suitable electrically conductive material. A plurality of conductive vias 316 are formed through insulating layer 312 by etching or drilling a via through insulating material 312 and filling the via with Al, Cu, Sn, Ni, Au, Ag, Ti, W, or other suitable electrically conductive material.

The topside interconnect structure 308 includes conductive layer 320, conductive layers and signal traces 322, which are separated by insulating layers 324. The insulating layers 324 can be SiO2, Si3N4, SiON, Ta2O5, ZrO2, Al2O3, or other suitable dielectric material. The insulating layers 324 are patterned or blanket deposited using PVD, CVD, printing, sintering, or thermal oxidation. The interconnect structure 308 is electrically connected to TSV 314 and conductive vias 316 and the active and passive devices within semiconductor die 300-306 to form functional electrical circuits according to the electrical design and function of the semiconductor die.

A solder resist layer 326 is formed over topside interconnect structure 308. A portion of solder resist layer 326 is removed by an etching process to expose conductive layer 322. An electrically conductive layer 327 is formed over interconnect structure 308 in the removed portions of solder resist layer 326 using a patterning and deposition process. An electrically conductive layer 328 is formed over conductive layer 327 using a patterning and deposition process. Conductive layers 327 and 328 can be Al, Cu, Sn, Ni, Au, Ag, or other suitable material. The deposition of conductive layers 327 and 328 use PVD, CVD, electrolytic plating, or electroless plating process. Conductive layers 327 and 328 are electrically connected to conductive layer 322 according to the electrical design and function of the die.

The bottom-side interconnect structure 310 includes conductive layer 330, conductive layers and signal traces 332, which are separated by insulating layers 334. The insulating layers 334 can be SiO2, Si3N4, SiON, Ta2O5, ZrO2, Al2O3, or other suitable dielectric material. The insulating layers 334 are patterned or blanket deposited using PVD, CVD, printing, sintering, or thermal oxidation. The interconnect structure 310 is electrically connected to TSV 314 and conductive vias 316 and the active and passive devices within semiconductor die 300-308 to form functional electrical circuits according to the electrical design and function of the semiconductor die.

A solder resist layer 336 is formed over bottom-side interconnect structure 310. A portion of solder resist layer 336 is removed by an etching process to expose conductive layer 332. An electrically conductive layer 337 is formed over interconnect structure 310 in the removed portions of solder resist layer 336 using a patterning and deposition process. An electrically conductive layer 338 is formed over conductive layer 337 using a patterning and deposition process. Conductive layers 337 and 338 can be Al, Cu, Sn, Ni, Au, Ag, or other suitable material. The deposition of conductive layers 337 and 338 use PVD, CVD, electrolytic plating, or electroless plating process. Conductive layers 337 and 338 are electrically connected to conductive layer 332 according to the electrical design and function of the die.

A semiconductor die 340 is mounted to solder resist layer 326. Semiconductor die 342 is mounted to semiconductor die 340. Semiconductor die 340 and 342 are electrically connected to core semiconductor die 300-308 through bond wires 344, conductive layers 327 and 328, interconnect structures 308 and 310, TSV 314, and conductive vias 316. An encapsulant or molding compound 346 is deposited over semiconductor die 340 and 342, bond wires 344, and solder resist layer 326 using a printing, compressive molding, transfer molding, liquid encapsulant molding, or other suitable applicator. Encapsulant 346 can be epoxy resin, epoxy acrylate, polymer, or polymer composite material. Encapsulant 346 is non-conductive and environmentally protects the semiconductor device from external elements and contaminants.

An electrically conductive solder material is deposited over conductive layer 338 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 348. In some applications, solder bumps 348 are reflowed a second time to improve electrical contact to conductive layer 338. Solder bumps 348 represent one type of interconnect structure that can be formed over conductive layer 338. The interconnect structure can also use bond wires, 3D interconnects, conductive paste, or other electrical interconnect.

Figure 9:
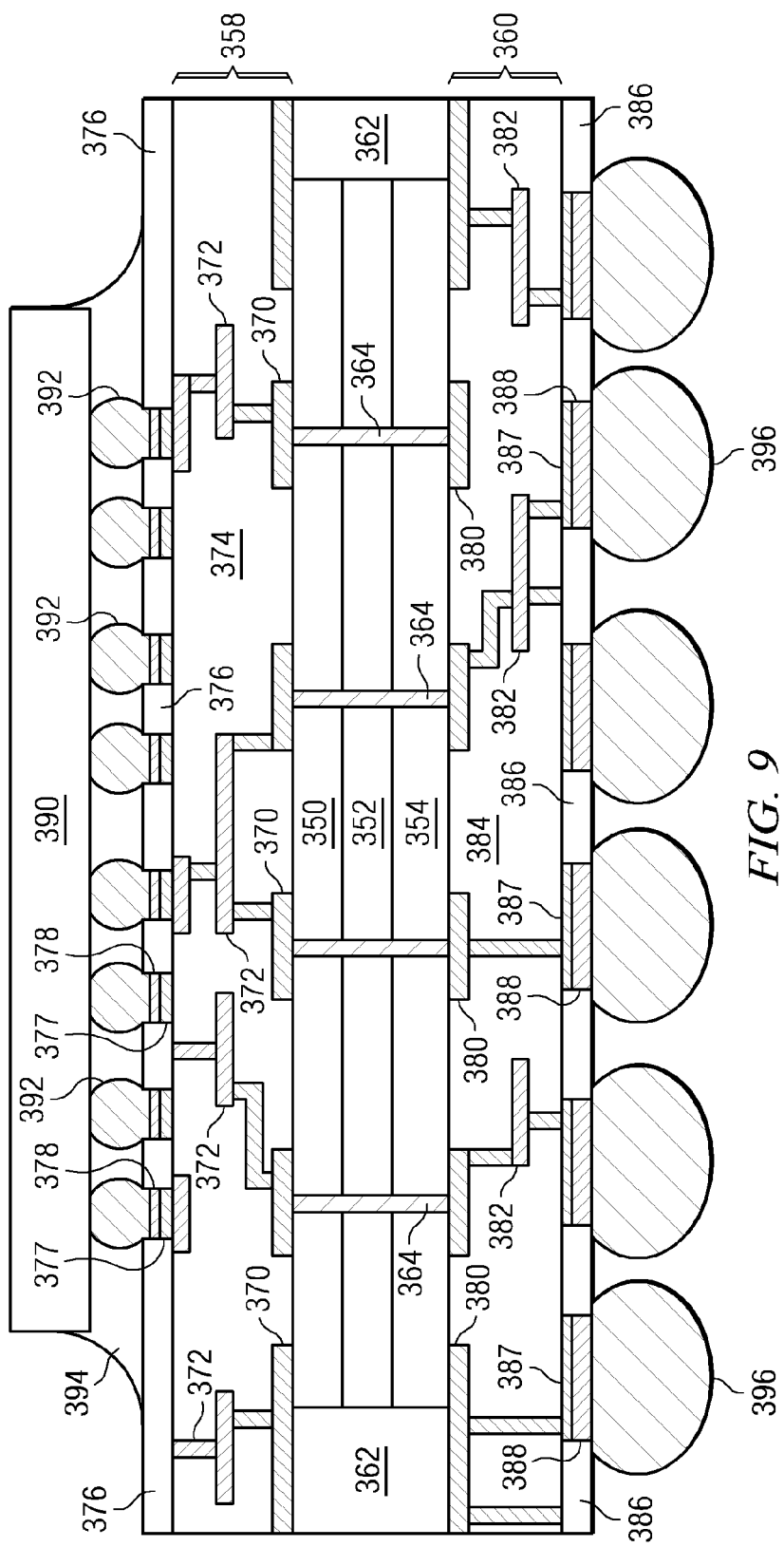
FIG. 9 illustrates a three TSV die core with a semiconductor die mounted to the interconnect structure.

In FIG. 9, the core semiconductor device includes a plurality of vertically stacked semiconductor die 350, 352, and 354 which are disposed between topside interconnect structure 358 and bottom-side interconnect structure 360 using a process similar to FIGS. 3a-3d. Semiconductor die 350-354 each includes a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 350-354 to implement ASIC or memory devices. An insulating layer 362 is deposited around core semiconductor die 350-354. The insulating layer 362 can be a thermosetting resin or photo-curable resin, such as epoxy resin, phenol resin, cyanate resin, fiberglass, fluorocarbon resin, PTFE resin, PPO resin, or PPE resin. The core semiconductor die 350-354 are thus embedded within insulating layer 362. A plurality of TSV 364 are formed through semiconductor die 350-354 by etching or drilling a via through the silicon material and filling the via with Al, Cu, Sn, Ni, Au, Ag, Ti, W, or other suitable electrically conductive material.

The topside interconnect structure 358 includes conductive layer 370, conductive layers and signal traces 372, which are separated by insulating layers 374. The insulating layers 374 can be SiO2, Si3N4, SiON, Ta2O5, ZrO2, Al2O3, or other suitable dielectric material. The insulating layers 374 are patterned or blanket deposited using PVD, CVD, printing, sintering, or thermal oxidation. The interconnect structure 358 is electrically connected to TSV 364 and the active and passive devices within semiconductor die 350-354 to form functional electrical circuits according to the electrical design and function of the semiconductor die.

A solder resist layer 376 is formed over topside interconnect structure 358. A portion of solder resist layer 376 is removed by an etching process to expose conductive layer 372. An electrically conductive layer 377 is formed over interconnect structure 358 in the removed portions of solder resist layer 376 using a patterning and deposition process. An electrically conductive layer 378 is formed over conductive layer 377 using a patterning and deposition process. Conductive layers 377 and 378 can be Al, Cu, Sn, Ni, Au, Ag, or other suitable material. The deposition of conductive layers 377 and 378 use PVD, CVD, electrolytic plating, or electroless plating process. Conductive layers 377 and 378 are electrically connected to conductive layer 372 according to the electrical design and function of the die.

The bottom-side interconnect structure 360 includes conductive layer 380, conductive layers and signal traces 382, which are separated by insulating layers 384. The insulating layers 384 can be SiO2, Si3N4, SiON, Ta2O5, ZrO2, Al2O3, or other suitable dielectric material. The insulating layers 384 are patterned or blanket deposited using PVD, CVD, printing, sintering, or thermal oxidation. The interconnect structure 360 is electrically connected to TSV 364 and the active and passive devices within semiconductor die 350-354 to form functional electrical circuits according to the electrical design and function of the semiconductor die.

A solder resist layer 386 is formed over bottom-side interconnect structure 360. A portion of solder resist layer 386 is removed by an etching process to expose conductive layer 382. An electrically conductive layer 387 is formed over interconnect structure 360 in the removed portions of solder resist layer 386 using a patterning and deposition process. An electrically conductive layer 388 is formed over conductive layer 387 using a patterning and deposition process. Conductive layers 387 and 388 can be Al, Cu, Sn, Ni, Au, Ag, or other suitable material. The deposition of conductive layers 387 and 388 use PVD, CVD, electrolytic plating, or electroless plating process. Conductive layers 387 and 388 are electrically connected to conductive layer 382 according to the electrical design and function of the die.

A semiconductor die 390 is mounted to conductive layer 378 with solder bumps 392. An underfill material 394, such as epoxy, polymeric material, film, or other non-conductive material, is deposited under semiconductor die 390. Semiconductor die 390 is electrically connected to core semiconductor die 350-354 through solder bumps 392, conductive layers 377 and 378, interconnect structures 358 and 360, and TSV 364.

An electrically conductive solder material is deposited over conductive layer 388 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 396. In some applications, solder bumps 396 are reflowed a second time to improve electrical contact to conductive layer 388. Solder bumps 396 represent one type of interconnect structure that can be formed over conductive layer 388. The interconnect structure can also use bond wires, 3D interconnects, conductive paste, or other electrical interconnect.

Figure 10:
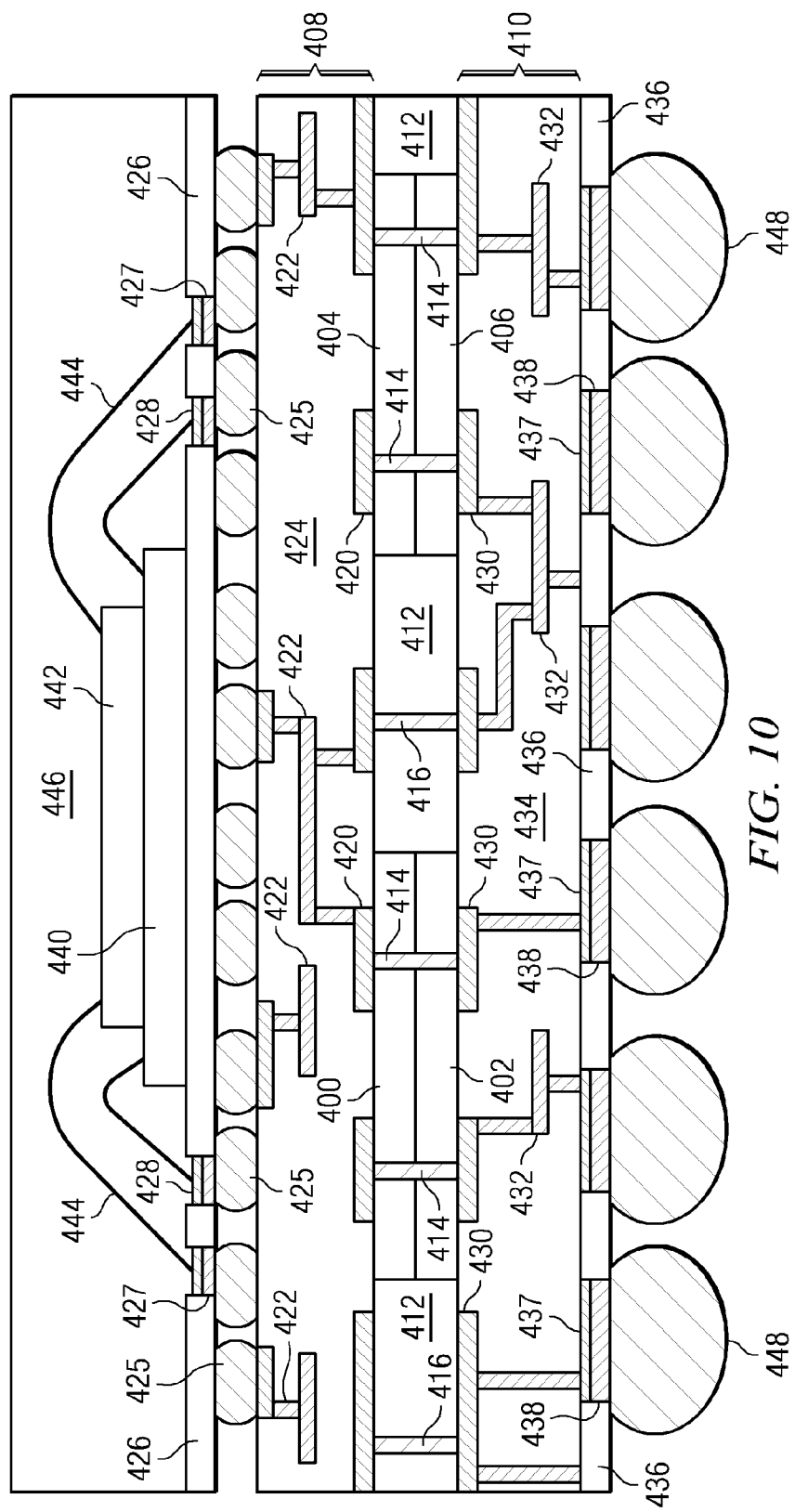
FIG. 10 illustrates a dual TSV die core with a semiconductor package mounted to the interconnect structure.

In FIG. 10, the core semiconductor device includes stacked semiconductor die 400 and 402 and stacked semiconductor die 404 and 406 which are disposed between topside interconnect structure 408 and bottom-side interconnect structure 410 using a process similar to FIGS. 3a-3d. Semiconductor die 400-406 each includes a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 400-406 to implement ASIC or memory devices. An insulating layer 412 is deposited around core semiconductor die 400-406. The insulating layer 412 can be a thermosetting resin or photo-curable resin, such as epoxy resin, phenol resin, cyanate resin, fiberglass, fluorocarbon resin, PTFE resin, PPO resin, or PPE resin. The core semiconductor die 400-406 are thus embedded within insulating layer 412. A plurality of TSV 414 are formed through semiconductor die 400-406 by etching or drilling a via through the silicon material and filling the via with Al, Cu, Sn, Ni, Au, Ag, Ti, W, or other suitable electrically conductive material. A plurality of conductive vias 416 are formed through insulating layer 412 by etching or drilling a via through insulating material 412 and filling the via with Al, Cu, Sn, Ni, Au, Ag, Ti, W, or other suitable electrically conductive material.

The topside interconnect structure 408 includes conductive layer 420, conductive layers and signal traces 422, which are separated by insulating layers 424. The insulating layers 424 can be SiO2, Si3N4, SiON, Ta2O5, ZrO2, Al2O3, or other suitable dielectric material. The insulating layers 424 are patterned or blanket deposited using PVD, CVD, printing, sintering, or thermal oxidation. The interconnect structure 408 is electrically connected to TSV 414 and conductive vias 416 and the active and passive devices within semiconductor die 400-406 to form functional electrical circuits according to the electrical design and function of the semiconductor die.

The bottom-side interconnect structure 410 includes conductive layer 430, conductive layers and signal traces 432, which are separated by insulating layers 434. The insulating layers 434 can be SiO2, Si3N4, SiON, Ta2O5, ZrO2, Al2O3, or other suitable dielectric material. The insulating layers 434 are patterned or blanket deposited using PVD, CVD, printing, sintering, or thermal oxidation. The interconnect structure 410 is electrically connected to TSV 414 and conductive vias 416 and the active and passive devices within semiconductor die 400-408 to form functional electrical circuits according to the electrical design and function of the semiconductor die.

A solder resist layer 436 is formed over bottom-side interconnect structure 410. A portion of solder resist layer 436 is removed by an etching process to expose conductive layer 432. An electrically conductive layer 437 is formed over interconnect structure 410 in the removed portions of solder resist layer 436 using a patterning and deposition process. An electrically conductive layer 438 is formed over conductive layer 437 using a patterning and deposition process. Conductive layers 437 and 438 can be Al, Cu, Sn, Ni, Au, Ag, or other suitable material. The deposition of conductive layers 437 and 438 use PVD, CVD, electrolytic plating, or electroless plating process. Conductive layers 437 and 438 are electrically connected to conductive layer 432 according to the electrical design and function of the die.

A semiconductor die 440 is mounted to solder resist layer 426. Semiconductor die 442 is mounted to semiconductor die 440. An electrically conductive layer 427 is formed in solder resist layer 426, which are electrically connected to interconnect structure 408. An electrically conductive layer 428 is formed over conductive layer 427 using a patterning and deposition process. Conductive layers 427 and 428 can be Al, Cu, Sn, Ni, Au, Ag, or other suitable material. The deposition of conductive layers 427 and 428 use PVD, CVD, electrolytic plating, or electroless plating process. Solder bumps 425 are formed over interconnect structure 408. The solder resist layer 426 is then disposed over solder bumps 425. Semiconductor die 440 and 442 are electrically connected to core semiconductor die 400-408 through bond wires 444, conductive layers 427 and 428, solder bumps 425, interconnect structures 408 and 410, TSV 414, and conductive vias 416. An encapsulant or molding compound 446 is deposited over semiconductor die 440 and 442, bond wires 444, and solder resist layer 426 using a printing, compressive molding, transfer molding, liquid encapsulant molding, or other suitable applicator. Encapsulant 446 can be epoxy resin, epoxy acrylate, polymer, or polymer composite material. Encapsulant 446 is non-conductive and environmentally protects the semiconductor device from external elements and contaminants.

An electrically conductive solder material is deposited over conductive layer 438 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 448. In some applications, solder bumps 448 are reflowed a second time to improve electrical contact to conductive layer 438. Solder bumps 448 represent one type of interconnect structure that can be formed over conductive layer 438. The interconnect structure can also use bond wires, 3D interconnects, conductive paste, or other electrical interconnect.

Figure 11:
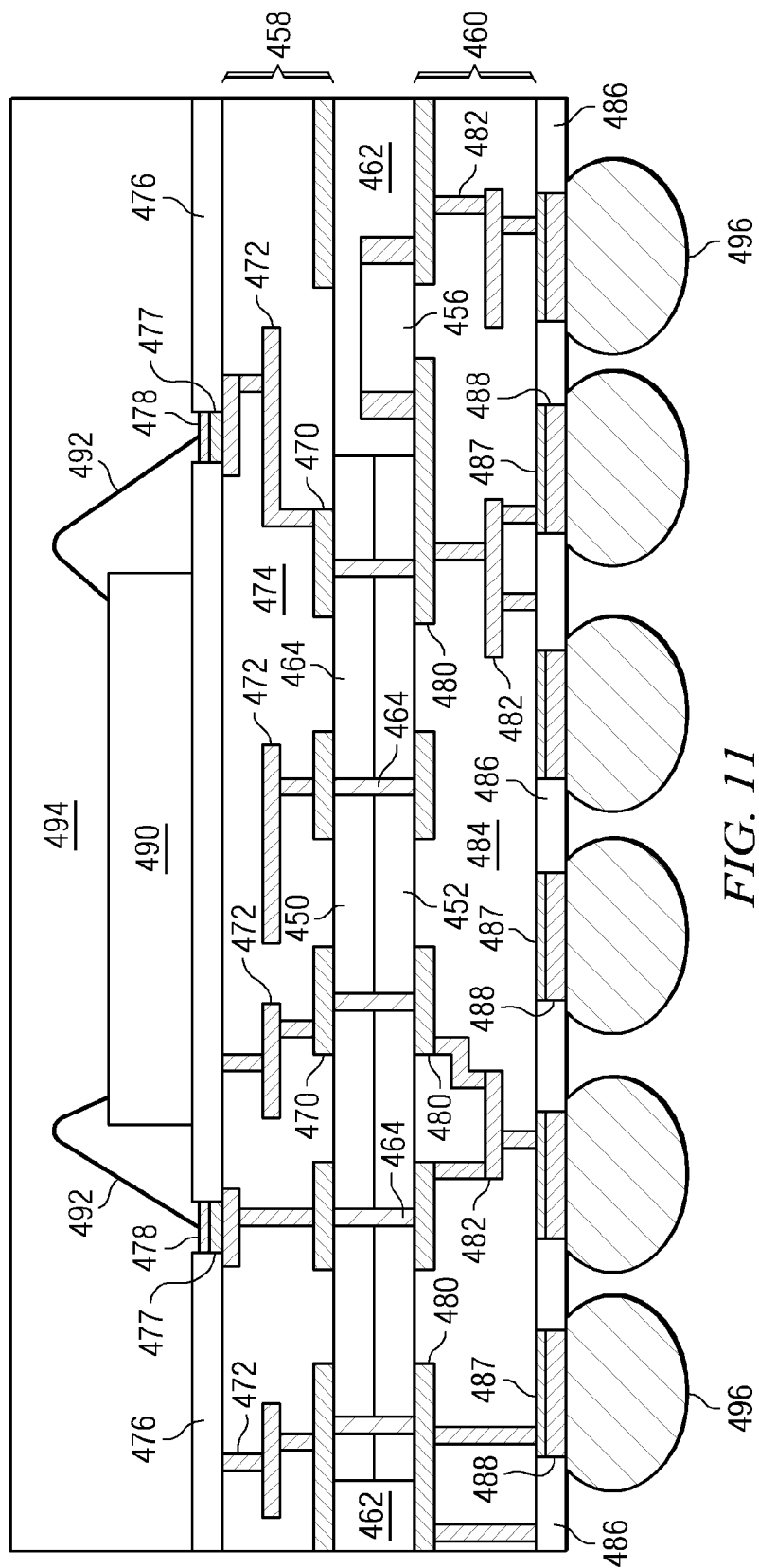
FIG. 11 illustrates a dual TSV die and component core with a semiconductor die mounted to the interconnect structure.

In FIG. 11, the core semiconductor device includes semiconductor die 450 and 452 and semiconductor component 456 which are disposed between topside interconnect structure 458 and bottom-side interconnect structure 460 using a process similar to FIGS. 3a-3d. Semiconductor die 450 and 452 each includes a substrate with an active area containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active area of die 450 and 452 to implement ASIC or memory devices. Semiconductor component 456 may be a passive device such as a large value capacitor or resistor. An insulating layer 462 is deposited around core semiconductor die 450 and 452 and semiconductor component 456. The insulating layer 462 can be a thermosetting resin or photo-curable resin, such as epoxy resin, phenol resin, cyanate resin, fiberglass, fluorocarbon resin, PTFE resin, PPO resin, or PPE resin. The core semiconductor die 450 and 452 and semiconductor component 456 are thus embedded within insulating layer 462. A plurality of TSV 464 are formed through semiconductor die 450 and 452 by etching or drilling a via through the silicon material and filling the via with Al, Cu, Sn, Ni, Au, Ag, Ti, W, or other suitable electrically conductive material.

The topside interconnect structure 458 includes conductive layer 470, conductive layers and signal traces 472, which are separated by insulating layers 474. The insulating layers 474 can be SiO2, Si3N4, SiON, Ta2O5, ZrO2, Al2O3, or other suitable dielectric material. The insulating layers 474 are patterned or blanket deposited using PVD, CVD, printing, sintering, or thermal oxidation. The interconnect structure 458 is electrically connected to TSV 464 and the active and passive devices within semiconductor die 450 and 452 semiconductor component 456 to form functional electrical circuits according to the electrical design and function of the semiconductor die.

A solder resist layer 476 is formed over topside interconnect structure 458. A portion of solder resist layer 476 is removed by an etching process to expose conductive layer 472. An electrically conductive layer 477 is formed over interconnect structure 458 in the removed portions of solder resist layer 476 using a patterning and deposition process. An electrically conductive layer 478 is formed over conductive layer 477 using a patterning and deposition process. Conductive layers 477 and 478 can be Al, Cu, Sn, Ni, Au, Ag, or other suitable material. The deposition of conductive layers 477 and 478 use PVD, CVD, electrolytic plating, or electroless plating process. Conductive layers 477 and 478 are electrically connected to conductive layer 472 according to the electrical design and function of the die.

The bottom-side interconnect structure 460 includes conductive layer 480, conductive layers and signal traces 482, which are separated by insulating layers 484. The insulating layers 484 can be SiO2, Si3N4, SiON, Ta2O5, ZrO2, Al2O3, or other suitable dielectric material. The insulating layers 484 are patterned or blanket deposited using PVD, CVD, printing, sintering, or thermal oxidation. The interconnect structure 460 is electrically connected to TSV 464 and the active and passive devices within semiconductor die 450 and 452 and semiconductor component 456 to form functional electrical circuits according to the electrical design and function of the semiconductor die.

A solder resist layer 486 is formed over bottom-side interconnect structure 460. A portion of solder resist layer 486 is removed by an etching process to expose conductive layer 482. An electrically conductive layer 487 is formed over interconnect structure 460 in the removed portions of solder resist layer 486 using a patterning and deposition process. An electrically conductive layer 488 is formed over conductive layer 487 using a patterning and deposition process. Conductive layers 487 and 488 can be Al, Cu, Sn, Ni, Au, Ag, or other suitable material. The deposition of conductive layers 487 and 488 use PVD, CVD, electrolytic plating, or electroless plating process. Conductive layers 487 and 488 are electrically connected to conductive layer 482 according to the electrical design and function of the die.

A semiconductor die 490 is mounted to solder resist layer 476. Semiconductor die 490 is electrically connected to core semiconductor die 450 and 452 and semiconductor component 456 through bond wires 492, conductive layers 487 and 488, interconnect structures 458 and 460, and TSV 464. An encapsulant or molding compound 494 is deposited over semiconductor die 490, bond wires 492, and solder resist layer 476 using a printing, compressive molding, transfer molding, liquid encapsulant molding, or other suitable applicator. Encapsulant 494 can be epoxy resin, epoxy acrylate, polymer, or polymer composite material. Encapsulant 494 is non-conductive and environmentally protects the semiconductor device from external elements and contaminants.

An electrically conductive solder material is deposited over conductive layer 488 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 496. In some applications, solder bumps 496 are reflowed a second time to improve electrical contact to conductive layer 488. Solder bumps 496 represent one type of interconnect structure that can be formed over conductive layer 488. The interconnect structure can also use bond wires, 3D interconnects, conductive paste, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first conductive layer;
   disposing a first semiconductor die over the first conductive layer;
   forming a first interconnect structure over the first conductive layer opposite the first semiconductor die;
   forming a conductive via through the first semiconductor die with the conductive via extending from a first surface of the first semiconductor die to a second surface of the first semiconductor die opposite the first surface;
   forming an insulating layer around the first semiconductor die;
   disposing a second conductive layer over the insulating layer and first surface of the first semiconductor die; and
   forming a second interconnect structure over the second conductive layer.

2. The method of claim 1, further including disposing a second semiconductor die over the first semiconductor die.

3. The method of claim 1, further including disposing a second semiconductor die over the second conductive layer.

4. The method of claim 3, further including disposing a third semiconductor die over the second conductive layer.

5. The method of claim 1, further including:
   forming the first conductive layer over a first substrate; and
   forming the second conductive layer over a second substrate.

6. A method of making a semiconductor device, comprising:
   providing a first semiconductor die including a first conductive via extending from a first surface of the first semiconductor die to a second surface of the first semiconductor die opposite the first surface;
   forming an insulating layer around the first semiconductor die;
   forming a first interconnect structure over the insulating layer and first surface of the first semiconductor die;
   forming a second interconnect structure over the insulating layer and second surface of the first semiconductor die; and
   forming a second conductive via through the insulating layer.

7. The method of claim 6, further including disposing a second semiconductor die including a second conductive via formed through the second semiconductor die over the first semiconductor die.

8. The method of claim 6, further including disposing a second semiconductor die including a second conductive via formed through the second semiconductor die adjacent to the first semiconductor die.

9. A method of making a semiconductor device, comprising:
   providing a first semiconductor die including a first conductive via extending from a first surface of the first semiconductor die to a second surface of the first semiconductor die opposite the first surface;
   forming an insulating layer around the first semiconductor die;
   forming a first interconnect structure over the insulating layer and first surface of the first semiconductor die;
   forming a second interconnect structure over the insulating layer and second surface of the first semiconductor die;
   disposing a second semiconductor die including a second conductive via formed through the second semiconductor die over the first semiconductor die; and
   depositing the insulating layer around the second semiconductor die.

10. The method of claim 6, further including:
    providing a conductive layer; and
    disposing the first semiconductor die over the conductive layer.

11. The method of claim 6, further including disposing a second semiconductor die over the second interconnect structure.

12. A semiconductor device, comprising:
    a first semiconductor die including a first conductive via formed through the first semiconductor die;
    a second semiconductor die including a second conductive via formed through the second semiconductor die disposed on the first semiconductor die;
    an insulating layer formed around the first semiconductor die;
    a first conductive layer formed over the insulating layer and a first surface of the first semiconductor die; and
    a second conductive layer formed over a second surface of the first semiconductor die opposite the first surface.

13. The semiconductor device of claim 12, further including a second semiconductor die disposed over the second conductive layer.

14. The semiconductor device of claim 12, further including a third semiconductor die disposed over the second semiconductor die.

15. The semiconductor device of claim 12, further including a second semiconductor die disposed adjacent to the first semiconductor die.

16. The semiconductor device of claim 12, further including an interconnect structure formed over the first conductive layer or second conductive layer.

17. The semiconductor device of claim 12, further including:
- a first substrate disposed over the first conductive layer; and
- a second substrate disposed over the second conductive layer.

18. A semiconductor device, comprising:
- a first substrate including a first conductive via formed through the first substrate;
- an insulating layer formed around the first substrate;
- a second conductive via through the insulating layer;
- a first interconnect structure formed over the insulating layer and a first surface of the first substrate;
- a second interconnect structure formed over a second surface of the first substrate opposite the first surface of the first substrate; and
- a second substrate including a second conductive via formed through the second substrate disposed over the first substrate.

19. A semiconductor device, comprising:
- a substrate including a first conductive via formed through the substrate;
- an insulating layer formed around the substrate;
- a second conductive via through the insulating layer;
- a first interconnect structure formed over the insulating layer and a first surface of the substrate; and
- a second interconnect structure formed over a second surface of the substrate opposite the first surface of the substrate, wherein the insulating layer is disposed between the first interconnect structure and second interconnect structure.

20. The semiconductor device of claim 19, further including a semiconductor die disposed over the second interconnect structure.

* * * * *